United States Patent [19]

Chen et al.

[11] Patent Number: 5,413,950
[45] Date of Patent: May 9, 1995

[54] METHOD OF FORMING A DRAM STACKED CAPACITOR CELL

[75] Inventors: Anchor Chen; Min-Tzong Yang; Chen-Chiu Hsue; Gary Hong, all of Hsin-Chu, Taiwan, Prov. of China

[73] Assignee: United Microelectronics Corporation, Hsinchu, Taiwan, Prov. of China

[21] Appl. No.: 231,461

[22] Filed: Apr. 22, 1994

[51] Int. Cl.[6] .............. H01L 27/00; H01L 21/70
[52] U.S. Cl. ........................ 437/52; 437/60; 437/919
[58] Field of Search ............. 437/47, 52, 60, 919

[56] References Cited

U.S. PATENT DOCUMENTS

| | | | |
|---|---|---|---|
| 5,061,650 | 10/1991 | Dennison et al. | 437/47 |
| 5,084,405 | 1/1992 | Fazan et al. | 437/52 |
| 5,126,916 | 6/1992 | Tseng | 361/313 |
| 5,192,702 | 3/1993 | Tseng | 437/52 |
| 5,200,635 | 4/1993 | Kaga et al. | 257/306 |
| 5,217,914 | 6/1993 | Matsumoto et al. | 437/47 |
| 5,233,212 | 8/1993 | Ohi et al. | 257/390 |
| 5,266,514 | 11/1993 | Tuan et al. | 437/52 |
| 5,330,928 | 7/1994 | Tseng | 437/52 |

OTHER PUBLICATIONS

"A Newly Designed Planar Stalked Capacitor Cell with High Dielectric Constant Film for 256Mbit DRAM", by T. Eimori et al, IEEE International Electronic Device Meeting Proceedings, Dec. 1993 pp. 631–634.

Primary Examiner—Olik Chaudhuri
Assistant Examiner—H. Jey Tsai
Attorney, Agent, or Firm—George O. Saile

[57] ABSTRACT

A new stacked capacitor structure having increased capacitance and a method of fabrication was accomplished. The capacitor stores data in the form of stored charge and together with a field effect transistor (MOSFET) make up the individual Dynamic Random Access Memory (DRAM) storage cells on a DRAM chip. The improved capacitor is fabricated using an electrically conducting layer in the bottom electrode of the capacitor, which is substantially different in composition from silicon. The conducting layer preferably being a refractory metal or a refractory metal silicides, such as, tungsten (W) or tungsten silicide (WSi). The bottom electrode is formed from a multilayer composed of a thin polysilicon layer, the conducting layer and an upper thicker polysilicon layer. Vertical capacitor sidewalls are formed from the upper polysilicon layer by photoresist masking and then etching to the conducting layer. The conducting layer provides an etch end point for accurately etching to the correct depth without over etching. This provides a repeatable and more manufacturable process. The stacked capacitor is then completed by depositing a high dielectric constant insulator layer over the bottom electrode and then forming the top capacitor electrode, thereby completing the stacked capacitor.

15 Claims, 5 Drawing Sheets

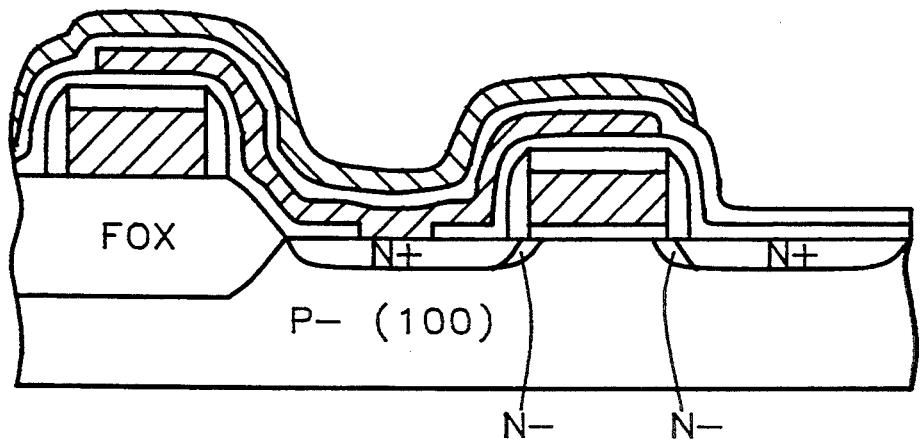
FIG. 1 - Prior Art
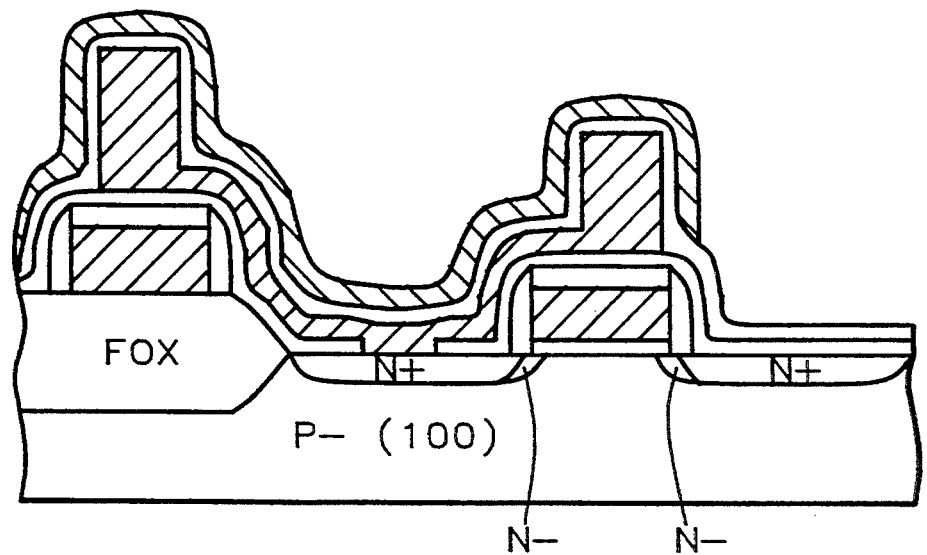
FIG. 2 - Prior Art

5,413,950

METHOD OF FORMING A DRAM STACKED CAPACITOR CELL

Related Patent Application

Ser. No. 08/239,130 filed May 6, 1994 entitled NEW DRAM CAPACITOR STRUCTURE by M-T Yang, C. C. Hsue and A. Chen.

BACKGROUND OF THE INVENTION

1. FIeld of the Invention

This invention relates to a random access memory device and more particularly, a method for fabricating a stacked storage capacitor having increased capacitance.

2. Description of the Prior Art

Very large scale integration (VLSI) semiconductor technologies have dramatically increased the circuit density on a chip. The miniaturized devices built in and on semiconductor substrate, making up these circuits, are very closely spaced and their packing density has increased significantly. More recent advances in photolithographic techniques, such as phase-shifting masks, and self-aligning process steps have further reduced the device size and increased circuit density. This has lead to ultra large scale integration (ULSI) with minimum device dimensions less than a micrometer and more than a million transistors on a chip. With this improved integrations, some circuit elements experience electrical limitation due to their down sizing.

One such circuit element experiencing electrical limitations is the array of storage cells on a dynamic random access memory (DRAM) chip. These individual DRAM storage cells, usually consisting of a single metal-oxide-semiconductor field effect transistor (MOSFET) and a single capacitor are used extensively in the electronic industry for storing data. A single DRAM cell stores a bit of data on the capacitor as electrical charge.

As the array of cells on the DRAM chip increase in number and the capacitor decreases in size, it becomes more difficult to maintain an acceptable signal-to-noise level. Also, these volatile storage cells require more frequent refresh cycles to retain their charge.

These storage capacitors can be formed either in the substrate, usually referred to as trench capacitor, or by forming a stacked capacitor on the substrate after first fabricating the field effect transistor. The latter approach has received considerable attention in recent years. However, since each stacked capacitor, in the array of cells, are confined within the cell area it is difficult to maintain sufficient capacitance, as the cell size decreases. As conventional methods of high resolution photolithography and anisotropic etching reach their limits, it becomes necessary to explore other methods for increasing the capacitance.

One method of increasing the capacitance is to roughen the surface of the bottom electrode of the capacitor to effectively increase the surface area without increasing its overall size. See, for example, H. C. Tuan et. al. U.S. Pat. No. 5,266,514. Another approach is to use an inter-electrode insulator having a high dielectric constant. See for example, "A Newly Designed Planar Stacked Capacitor Cell with High Dielectric Constant Film for 256 Mbit DRAM" by T. Eimori et al, IEEE International Electronic Device Meeting Proceedings, Dec. 1993 page 631–634. A third approach, which has received much attention, is to build three dimensional capacitor structure extending vertically upward over the cell area. For example, see H-H Tseng, U.S. Pat. No. 5,126,916. In that patent, a free standing insulating sidewall is formed over the cell area. Then the bottom electrode, the inter-electrode dielectric and the top electrode are deposited over the insulating sidewall to form the capacitor. Another approach by P. Fazan et al, U.S. Pat. No. 5,084,405 uses a double sidewall technique to form a double ring stacked cell structure. A number of other inventions also teach methods of forming vertical capacitor structures, either by forming multiple sidewalls and/or by timed etching. For example, see U.S. Pat. Nos. 5,061,650, to C. H. Dennison, 5,217,914, to S Matsumoto, and 5,192,702, to H-H Tseng.

However, many of these methods require additional processing steps and planar structure which make the manufacturing process more complex and costly. Also, other process methods rely on etching to a predetermined etch depth which can be quite difficult to control in a manufacturing environment. For example, during plasma etching outgassing, virtual or real leaks, back streaming from pumps and loading effects, to name a few, can change the chemistry of the etching environment in the process chamber. This makes a calibrated etch time approach difficult to control. Therefore, it is very desirable to develop processes that are as simple as possible and also provide means for monitoring the etch depth in situ during processing by providing an end point detect. This invention address the later concern.

In the prior art, as shown by the schematic cross-sectional view in FIG. 1, a conventional DRAM cell usually has a stacked capacitor with a minimal electrode surface area. In more advanced structures of the prior art, as shown in FIG. 2, extended sidewalls are formed by etching a recess in a thick bottom electrode layer to increase the electrode area. However, it is difficult to accurately and repeatable control the etch depth by a timed etch.

SUMMARY OF THE INVENTION

It is the principal object of the invention to provide a new process and a new stacked capacitor structure for producing a DRAM memory cell having increased capacitance.

It is another object of the invention to provide a repeatable manufacturing process by introducing a method for etching repeatedly to a precise depth in forming the vertical sidewalls on the bottom electrode.

It is still another object of the invention to form this storage capacitor with an economy of processing steps to maintain a high yield, good reliability and low cost.

These goals are achieved by incorporating an additional layer in the bottom polysilicon electrode of the capacitor. The-layer which is composed of a material substantially different in composition from polysilicon is used as the etch end point layer. The method for fabricating a dynamic random access memory (DRAM) cell having this new stacked capacitor is now described.

The fabrication process starts by first forming a relatively thick field oxide on the surface of the semiconductor substrate surrounding and isolating an array of active device regions wherein field effect transistors will be fabricated. A thin gate oxide is then grown on the substrate surface in the active device regions. A relatively thick polysilicon layer is deposited over the gate oxide and the field oxide. The polysilicon layers is then patterned to form the gate electrodes of the field effect transistors (MOSFET) in the device regions and conducting patterns elsewhere on the field oxide. Lightly doped source/drain regions are then formed adjacent to the gate electrodes in the active device regions. Insulating sidewalls are next formed by depositing an insulating layer and anisotropically etching back this layer to the substrate surface. The source/drain are then formed by implantation of a N-type impurity to complete the field effect transistor.

The stacked capacitor, incorporating a multilayer bottom electrode, is now formed by depositing a thin doped polysilicon layer followed by the deposition of a conducting layer other than polysilicon. For example, a refractory metal or metal silicide such as tungsten (W), tungsten silicide (WSi), or titanium (Ti) can be used. An electrically conducting nitride layer, such as titanium nitride (TIN), can also be used. Next, a relatively thick polysilicon layer is deposited and doped with a N-type impurity to complete the bottom electrode deposition.

The inner vertical sidewall of the bottom electrode is formed by masking and anisotropically etching the thick top polysilicon to the electrically conducting layer. This interface layer is very important because it provides the means for accurately etching to the correct depth, which is required for a manufacturable process. The end point of the etch process is accurately determined by in situ monitoring the change in the intensity of the optical emission of the spectral line from one of the etch product species using optical emission spectroscopy. The bottom electrode of the storage capacitor is completed by masking the electrode area a second time and anisotropically etching through all three layers to the underlying insulator, forming the outer vertical sidewalls of the electrode. A high dielectric insulator is deposited to form the inter-electrode insulator, and another doped polysilicon layer is deposited to form the top electrode and complete the array of storage capacitors.

BRIEF DESCRIPTION OF THE DRAWINGS

The objects and advantages of this invention are best understood by the preferred embodiment with reference to the attached drawings which are now briefly described.

FIG. 1 is a schematic cross-sectional view of a conventional DRAM cell with a stacked storage capacitor having minimal electrode surface area.

FIG. 2 shows a cross-sectional view of a DRAM cell with a stacked storage capacitor, but with a recess in the polysilicon electrode to increase electrode area. Accurate and repeated control of the etch depth can be difficult because of the timed etch.

FIG. 5 is after photoresist removal.

DESCRIPTION OF THE PREFERRED EMBODIMENTS

Now in keeping with the objects of this invention, the method for forming a DRAM storage capacitor having vertical sidewalls and increased capacitance is described in detail. The sequence of fabrication steps are shown in FIGS. 3 to 8. The process for forming the Field Oxide (FOX) and the field effect transistor (MOSFET) structure as presently practiced in manufacturing DRAM cells are only briefly described in order to better understand the current invention.

It should also be well understood by one skilled in the art that by including additional process steps, not described in this embodiment, other types of devices can also be included on the DRAM chip. For example, P channel MOSFETs can be formed by providing N-Wells in the P substrate and CMOS circuits can be formed therefrom. It should also be understood that the Figs. depict only one DRAM storage cell out of a multitude of cells that are fabricated simultaneously on the substrate.

Figure 3:
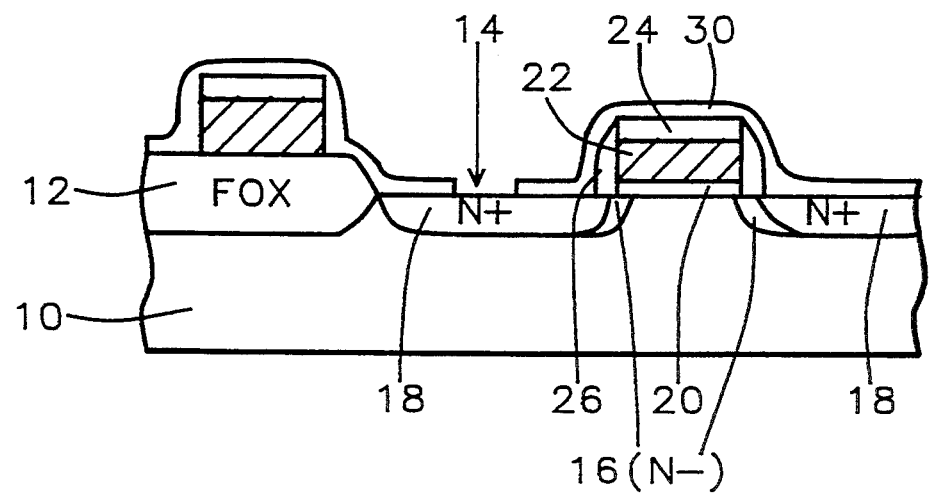
FIG. 3 is a schematic cross-sectional view of a partially completed DRAM cell prior to forming the stacked capacitor of this invention. Shown is a portion of the field oxide, the field effect transistor and the opening to a source/drain contact that will form the node contact for the capacitor.

Referring now to FIG. 3, a cross-sectional view of the substrate 10 having a partially completed DRAM cell formed on and in the substrate surface, is schematically shown. The preferred substrate is composed of a P-type single crystal silicon having a (100) crystallographic-orientation. A relatively thick Field Oxide (FOX) 12 is formed around the active device areas to electrical isolate these areas. This field oxide, only partially shown in FIG. 3, is formed by masking the active device areas with a thin silicon oxide (pad oxide) and a thicker silicon nitride layer which forms an oxidation barrier. The silicon substrate is then oxidized in an oxidizing ambient to form the field oxide. The preferred thickness being in the range of about 4500 to 5500 Angstroms.

The semiconductor device is then formed in the active device area after removing the silicon nitride barrier layer and the pad oxide in a conventional wet etch. The most commonly used device for dynamic random access memory is the metal-oxide-semiconductor field effect transistor (MOSFET). This device is formed by first thermally oxidizing the active device area to form a thin gate oxide 20. The preferred thickness being from about 90 to 200 Angstroms. An appropriately doped polysilicon layer 22 and an insulating layer 24 are deposited on substrate 10 and conventional photolithographic techniques and etching are used to pattern the insulating layer 24 and the polysilicon layer 22. This forms the gate electrode 22 of the MOSFET in the active device areas and conducting patterns elsewhere on the substrate having an insulating layer 24 thereon. Portions of these conducting patterns form the word lines that electrically connect the MOSFET gate electrode to the appropriate peripheral circuits on the DRAM chip. The lightly doped source/drain 16 of the N-channel MOSFET is formed next, usually by implanting a N-type atomic species such as arsenic or phosphorus. For example a typical implant might consist of phosphorus $P^{31}$ at a dose of between 1 and 10 E 13 atoms/cm$^2$ and at an energy between about 30 to 80 Kev.

After forming the lightly doped source/drain, sidewall spacers 26 are formed on the gate electrode sidewalls. These sidewall spacers are formed by depositing a low temperature silicon oxide and anisotropically etching back to the silicon surface. For example, the silicon oxide could be a chemical vapor deposition using tetraethoxysilane (TEOS) at a temperature in the range of about 650° to 900° C. and the etch back performed in a low pressure reactive ion etcher.

The source/drain regions of the MOSFET are now implanted with a N type atomic species, for example, arsenic ($As^{75}$), to complete the source/drain. The implantation is usually done through a thin layer of silicon oxide of about 200 to 300 Angstroms in thickness, to minimize implant channeling and to protect against contamination by metals and other impurities. A typical implantation dose being between about 2 E 15 to 1 E 16 atoms/cm$^2$ and an energy of between about 20 to 70 Kev.

The remainder of this embodiment relates more specifically to the objects of the invention, which relate to the formation of the stacked capacitor having increased capacitance and also provides a more manufacturable process. This new capacitor structure is formed using a multi-layered bottom electrode. Although the figures depict contact opening that are not self-aligned to the source/drain 18, it should be understood by one skilled in the art that these storage capacitors can also be formed on self-aligned source/drain contacts, further reducing the cell size and increasing the DRAM cell density.

Still referring to FIG. 3, a first insulating layer 30, composed in part of silicon nitride, is deposited over the active device areas having MOSFETs and source/drain areas formed thereon and over the thick field oxide elsewhere on the substrate. The preferred composition of the first insulating layer is a low temperature silicon oxide such as the chemical vapor deposited (CVD) of tetraethoxysilane having a thickness between about 1000 to 3000 Angstroms and an upper silicon nitride layer having a thickness between about 300 to 1000 Angstroms. The formation of the silicon nitride layer can be accomplished by a low pressure chemical vapor deposition (LPCVD) by the reaction of dichlorsilane ($SiCl_2H_2$) and ammonia ($NH_3$) at a temperature in the range between about 700° to 800° C. This silicon nitride provide an excellent barrier to sodium ion diffusion which can case electrical degradation.

The contact opening 14 for the capacitor node contact, of the storage capacitor, is now selectively formed to one of the two source/drain areas by etching through the first insulating layer 30. The contact opening is formed by using conventional photolithographic techniques and etching in a low pressure plasma etcher having a high silicon oxide to silicon etch-rate selectivity. For example, a gas mixture of carbon tetrafluoride and hydrogen ($CF_4/H_2$) can be used as the etching gas.

Figure 4:
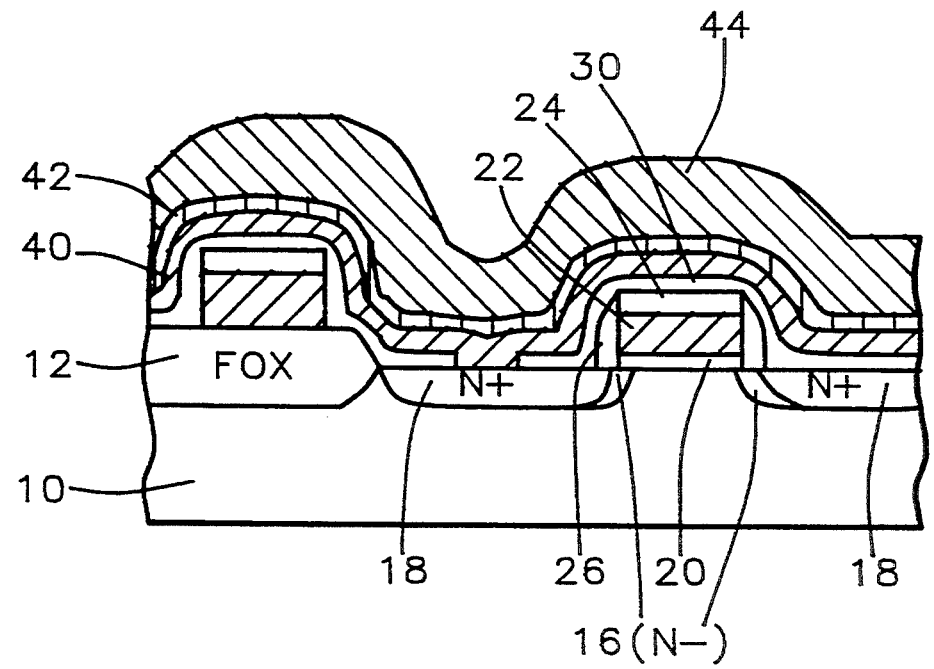
FIG. 4 is a schematic cross-sectional view of the DRAM cell in FIG. 3 showing the deposition of the multilayered bottom electrode consisting of a thin first polysilicon layer, an electrically conducting layer and a thick second polysilicon layer.

Referring now to FIG. 4, the bottom electrode of the storage capacitor is formed by depositing a film composed of three layers. A relatively thin first polysilicon layer 40 is deposited over the first insulating layer 30 and in the contact opening 14, forming the capacitor node contact to source/drain contact. The preferred thickness of this layer is between about 300 to 1000 Angstroms. The process of choice for depositing the layer is in a low pressure chemical vapor deposition (LPCVD) reactor and at a temperature between about 550° to 650° C. The polysilicon layer 40 is then doped N-type by implanting arsenic or phosphorus ion having an implant dose of between 1 E 15 to 20 E 15 atoms/cm$^2$ and an ion energy between about 20 to 80 Kev. Alternatively, the polysilicon layer 40 can be doped in situ during the polysilicon deposition.

An electrically conducting layer 42 is deposited over the first polysilicon layer 40 being substantially different in composition to the polysilicon layer. This difference in composition is very important because it is used at a later process step to accurately determine the end point stop for etching. And it is this accuracy in etching which makes the process repeatable from wafer to wafer and process run to process run providing a manufacturable process. The accuracy of this end point detect also makes the control of the vertical height of the stacked capacitor more accurate and repeatable.

The material of choice for this electrically conducting layer is selected from the group consisting essentially of refractory metals and refractory metal silicides. The preferred materials in this group are tungsten (W), titanium (Ti), tungsten silicide (WiSi) and titanium silicide (TiSi). A high conductivity nitride, such as titanium nitride (TIN), can also be used. The preferred deposition method depends on the refractory metal or refractory metal silicide used as the electrically conducting layer 42. When tungsten (W) is used, the preferred deposition is a chemical vapor deposition using tungsten hexafluoride (WF6) as the source gas in the reactor with a process temperature in the range of about 380° to 420° C. For an electrically conducting layer 42 composed of silicide, a variety of deposition methods can be used. For example, co-evaporation, co-sputtering, chemical vapor deposition and direct metallurgical reaction techniques are some of the choices. The preferred method of forming a silicide layer for the electrically conducting layer 42 is a metallurgical reaction technique in which the metal is deposited on the first polysilicon layer 40 and then annealed to reactively form the silicide in a temperature range between about 600° to 900° C. Alternatively, an ultra thin oxide on the first polysilicon layer 40, such as the native oxide that is formed during normal wet processing, can also be used as an end point detect layer. The preferred thickness of this thin oxide is between about 20 to 60 Angstroms. See Example I in FIG. 9 for a typical optical emission trace of a Polysilicon etch using a thin native oxide as the end point detect layer.

Referring still to FIG. 4, a relatively thick second polysilicon layer 44 is deposited on the electrically conducting layer 42. The vertical sidewalls of the bottom electrode are then formed from this layer. The preferred thickness of polysilicon layer 44 is between about 1500 to 4000 Angstroms. The preferred method of deposition is a LPCVD technique having a processing temperature between about 550° to 650° C. This second polysilicon layer 44 is doped N-type by implanting with arsenic or phosphorus having an implantation dose of between about 1 E 15 to 20 E 15 atoms/cm$^2$ and an ion energy between about 20 to 180 Kev.

Figure 5:
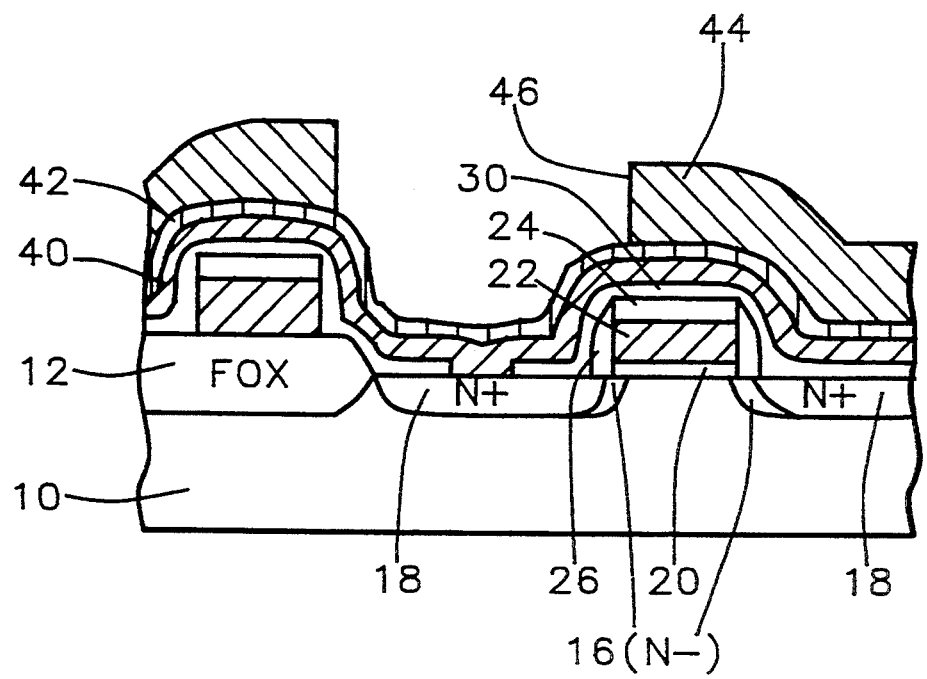
FIG. 5 is a schematic cross-sectional view of the DRAM cell in FIG. 4 showing the recess in the bottom electrode layer after masking and etching the second polysilicon layer to the electrically conducting etch stop layer.

Referring next to FIG. 5, conventional photolithographic techniques are used to define an opening over the capacitor area. The Polysilicon layer 44 is then etched to the surface of the electrically conducting layer 42 to form the inner sidewall 46 of the bottom electrode. The etch end point is accurately determined by using optical emission spectroscopy and monitoring one of the spectral lines of the etch product over the wafer in the plasma chamber. For example, one can monitor the spectra emission from the silicon fluoride (SiF) by-product having a spectral wavelength of 4050 Angstroms. The technique relies on the change in the emission intensity of the characteristic spectral line as the etched surface changes from one type of material to another. In this way the end point can be accurately detected when the second polysilicon layer 44 is etched to the electrically conducting layer 42. The etch process is then terminated. This provides a means for etching accurately from wafer to wafer and from process run to process run making a more manufacturable process. The height of the sidewall is therefore, equal to the thickness of the second polysilicon layer 44 which is easier to control than a timed etching in a single layer polysilicon. A sample end point trace that monitors the optical emission from an etch by-product from the plasma over the wafer in the process chamber is shown in FIG. 10. The wavelength of the optical emission is 4050 Angstroms and is from the silicon fluoride (SiF) species.

Figure 6:
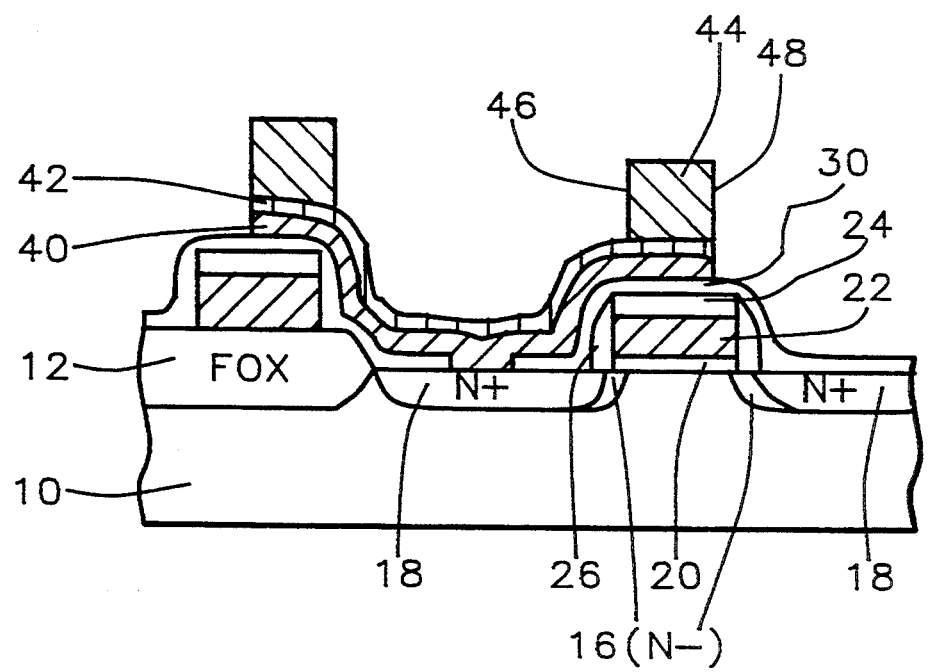
FIG. 6 is a schematic cross-sectional view of the DRAM cell in FIG. 5 showing the formation of the bottom electrode after the electrode area was masked with photoresist and the multi-layers were etched to complete and electrically isolate the electrode.

Referring now to FIG. 6, photolithographic techniques are again used to mask the bottom electrode area and an anisotropic etch is used to form the outer sidewall 48 of the bottom capacitor electrode. The cross section in FIG. 6 is shown after the photoresist is stripped. All three layers 40, 42 and 44 are etched to the first insulation layer 30, completing the bottom capacitor electrode. FIG. 6 depicts the cross section of only one of a multitude of electrodes fabricated simultaneously on the substrate. Each electrode being electrically isolated from the others. The process of choice for the etching is done in a low pressure plasma etcher having a gas mixture and process parameters which provide a high etch selective between polysilicon and silicon oxide. Optical emission spectroscope can be used to further improve the etch accuracy.

Figure 7:
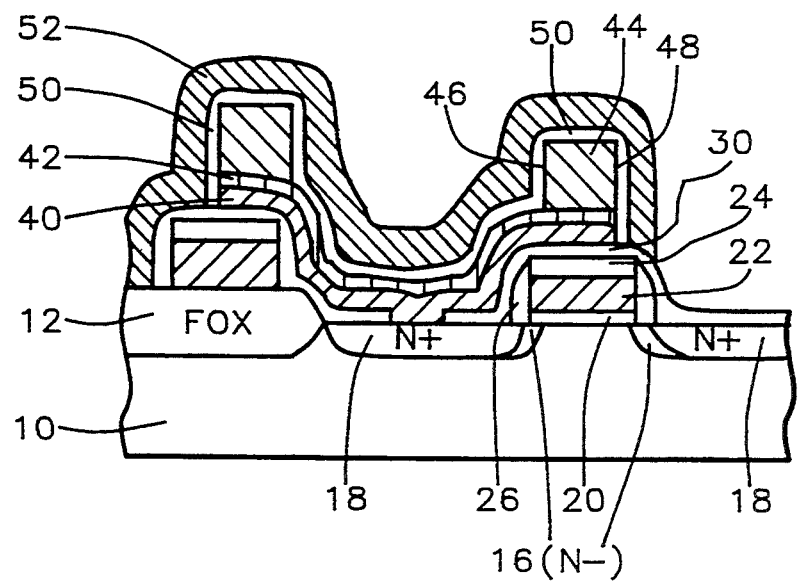
FIG. 7 is a schematic cross-sectional view of the DRAM cell in FIG. 6 showing the completed storage capacitor with the high dielectric inter-electrode insulator and the top polysilicon layer in place.

Referring to FIG. 7, the storage capacitor is completed by depositing a dielectric layer 50 having a high dielectric constant and then depositing a third polysilicon layer 52 to form the top capacitor electrode and complete the storage capacitor of the DRAM cell.

The preferred thickness of the dielectric layer 50 is in the range of about 30 to 250 Angstroms. The material of the dielectric layer can be any suitable material having a high dielectric constant and being continuous and pin hole free. The preferred dielectric layer 50 being a silicon oxide—silicon nitride—silicon oxide (ONO) layer having a total thickness in the range between about 30 to 250 Angstroms. Alternatively, other high dielectric constant materials can be used. For example, tantalum pentoxide and suitable combinations thereof.

Still referring to FIG. 7, the third polysilicon layer 52 is deposited over the dielectric layer 50 and conventional photolithographic techniques and anisotropic etching are used to suitably pattern the layer and forming the top capacitor electrode. The preferred thickness of the third polysilicon layer 52 is between about 500 to 3000 Angstroms. The preferred deposition technique is performed in a LPCVD reactor at a temperature in the range of about 550° to 650° C.

Figure 8:
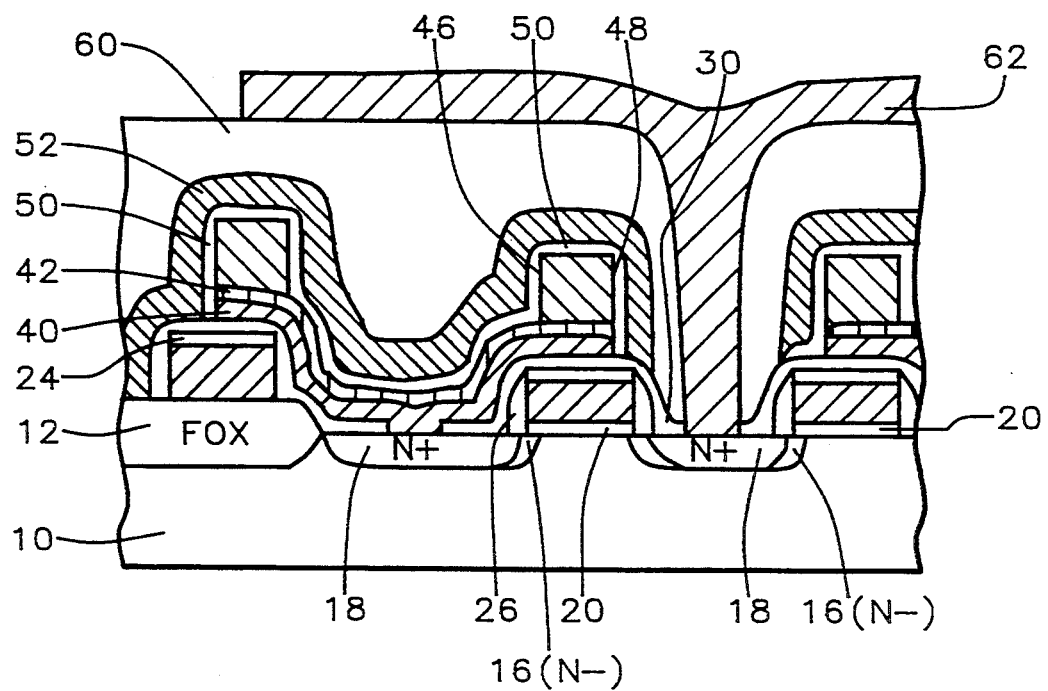
FIG. 8 is a schematic cross-sectional view of the DRAM cell in FIG. 7 after depositing a borophosphosilicate (BPSG) insulating layer, opening a bit line contact to the second of the two source/drain contacts of the MOSFET and then forming a polysilicide bit line to complete the DRAM cell.

Referring now to FIG. 8, a cross sectional view of a single completed DRAM cell of an array of cells is shown. A second insulating layer 60 is deposited over the DRAM cell. The preferred second insulating layer 60 is composed of two insulating materials, an undoped silicon oxide layer deposited by atmospheric pressure chemical vapor deposition (APCVD) and having a thickness of between about 500 to 2000 Angstroms followed by a low flow temperature glass composed of borophosphosilicate glass (BPSG) having a thickness in the-range of about 3000 to 8000 Angstroms. The BPSG is then annealed to planarize the surface. The bit line contact mask and an appropriate photolithographic process are used to open the bit line contact in the insulating layer 60 and the first insulating layer 30 to the second of the two source/drain contacts of the MOSFET. A fourth polysilicon layer 62 is deposited and doped N-type to form the bit line metallurgy. Alternatively, a silicide layer can be formed on the fourth polysilicon layer 62 to increase its conductivity. The preferred method being the deposition of a thin metal layer followed by a low temperature anneal to form the silicide. The preferred metal silicide being tungsten silicide (WSi). The polysilicon/silicide bit line wiring is then formed using a photolithographic process and a reactive ion etch process to complete the DRAM storage cell.

While the invention has been particularly shown and described with reference to the preferred embodiments thereof, it should be understood by those skilled in the art that various changes in form and details may be made without departing from the spirit and scope of the invention.

EXAMPLE I

Figure 9:
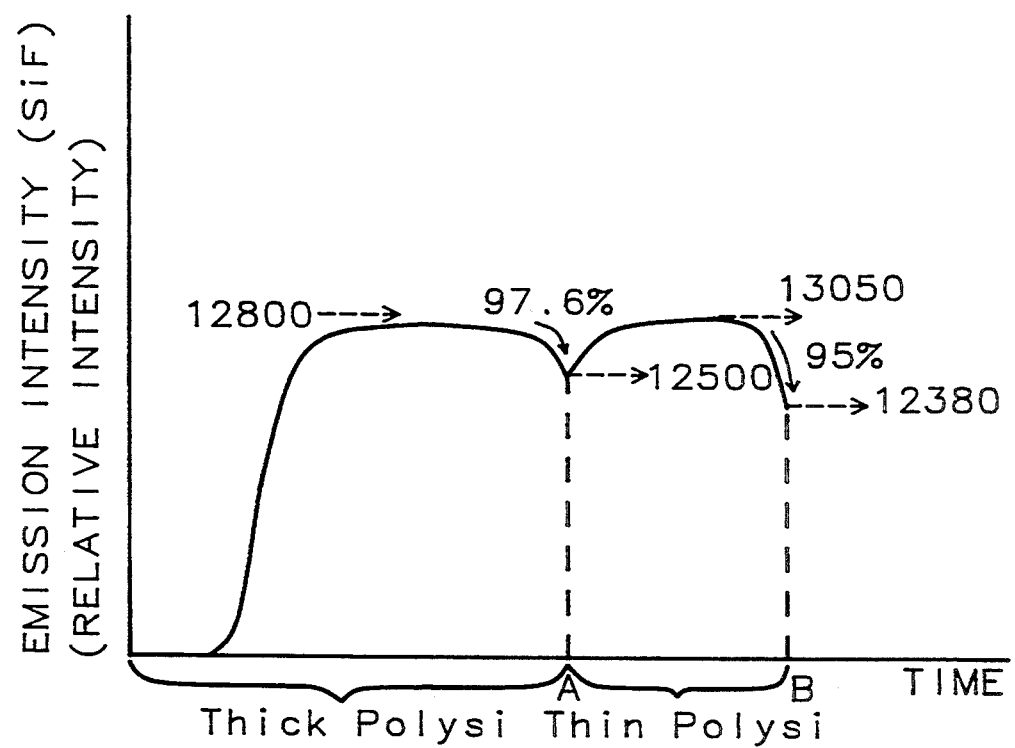
FIG. 9 is an example of an in situ etch endpoint trace of the intensity of the optical emission from the silicon fluoride (SiF) etch by-product. The observed decrease in intensity is used to accurately and repeatedly terminated the etch process.

A polysilicon layer having a thickness of 500 Angstroms was deposited on a thermally oxidized silicon wafer. A native oxide, about 30 Angstroms thick, was formed on the polysilicon surface by exposing the wafer to air. A thicker layer of polysilicon, having a thickness of 3000 Angstroms, was deposited over the first polysilicon layer which had the native oxide formed thereon. The wafer was then etched through the polysilicon layers in a plasma etcher. The optical emission intensity of the spectral line from the silicon fluoride (SiF) etch by-product, having a wavelength of 4050 Angstroms, was monitored in situ using optical emission spectroscopy. The results are shown in FIG. 9. The emission intensity is observed to decrease at the native oxide layer at point A after etching away the thick polysilicon layer and again at the oxidize wafer surface at point B after etching away the thin polysilicon layer. This technique is used in the invention to etch the second polysilicon layer to the electrically conducting layer or, alternatively, to the thin native oxide to accurately and repeatedly form the inner vertical sidewall of the bottom electrode without over etching.

What is claimed is:

1. A method for fabricating a capacitance stacked capacitor having a bottom electrode on a semiconductor substrate having device areas formed therein comprising the steps of:

depositing a first insulating layer composed in part of silicon nitride over said device area and elsewhere over said substrate;

forming opening in said first insulating layer to said device area providing a contact opening for the bottom capacitor electrode of said stacked capacitor;

depositing a first polysilicon layer over said substrate and said contact opening thereby making electrical contact to said device area;

depositing an electrically conductive layer on said first polysilicon layer; and depositing a second polysilicon layer on said electrically conductive layer being thicker than said first polysilicon layer;

masking and etching said second polysilicon layer to end point detect over stacked capacitor area and to said electrically conducting layer and forming vertical inner sidewall of said bottom capacitor electrode;

masking said stacked capacitor area and etching elsewhere on said substrate said second polysilicon layer, said electrically conducting layer and said first polysilicon layer to surface of said first insulating layer and forming said bottom capacitor electrode having vertical outer sidewall;

depositing a capacitor dielectric layer over and around said bottom capacitor electrode and elsewhere on said substrate; and depositing a third polysilicon layer over said capacitor dielectric layer and forming a top capacitor electrode layer;

masking over said stacked capacitor area and etching completely said third polysilicon layer to surface of said capacitor dielectric layer forming said top capacitor electrode and completing said capacitance stacked capacitor.

2. The method of claim 1, wherein said first insulating layer comprises a layer of silicon oxide and a top layer of silicon nitride wherein the thickness of said silicon oxide layer is between about 1000 to 3000 Angstroms and the thickness of said silicon nitride layer is between about 300 to 1000 Angstroms.

3. The method of claim 1, wherein the thickness of said first polysilicon layer is between about 300 to 1000 Angstroms.

4. The method of claim 1, wherein said first polysilicon layer is doped N-type having a concentration between about 1 E 20 to 1 E 22 atoms/cm$^3$.

5. The method of claim 1, wherein said electrically conducting layer is a metal silicide.

6. The method of claim 5, wherein said electrically conducting layer provides an etch end point detect layer for said second polysilicon layer etch.

7. The method of claim 1, wherein the thickness of said electrically conducting layer is between about 100 to 500 Angstroms.

8. The method of claim 1, wherein said electrically conducting layer can alternately be replaced by an ultra thin oxide layer having a thickness of between about 20 to 50 Angstroms.

9. The method of claim 1, wherein the thickness of said second polysilicon layer is between about 1500 to 4000 Angstroms.

10. The method of claim 1, wherein said capacitor dielectric layer is silicon oxide/silicon nitride/silicon oxide.

11. The method of claim 10, wherein said capacitor dielectric layer is between about 30 to 250 Angstroms in thickness.

12. The method of claim 1, wherein the thickness of said third polysilicon layer is between about 500 to 3000 Angstroms.

13. The method of claim 1, wherein said masking and etching comprises the steps of photoresist masking and anisotropic etching in a low pressure plasma etcher.

14. The method of claim 1, wherein said end point detect is performed by monitoring the change in the emission intensity of a selected spectral line using optical emission spectroscopy techniques.

15. The method of claim 1, wherein said contact opening forms the node contact of said stacked capacitor to source/drain of a field effect transistor in said device area and forming a dynamic random access memory cell.

* * * * *